United States Patent [19]

Megeid

[11] Patent Number: 4,622,586

[45] Date of Patent: Nov. 11, 1986

[54] DIGITAL SLICER HAVING A PULSE-WIDTH LOCKED LOOP

[75] Inventor: Mohamed M. A. Megeid, Canton, Switzerland

[73] Assignee: RCA Corporation, Princeton, N.J.

[21] Appl. No.: 719,803

[22] Filed: Apr. 4, 1985

[51] Int. Cl.[4] .......................... H04N 5/10; H03B 1/00; H04B 9/00
[52] U.S. Cl. ............................... 358/153; 358/158; 328/139; 455/608; 307/234; 307/527; 375/111
[58] Field of Search ................... 358/150, 153, 158.19; 328/139, 164; 329/106; 307/231, 234, 527; 375/111, 113; 370/77; 455/608

[56] References Cited

U.S. PATENT DOCUMENTS

| | | | |
|---|---|---|---|
| 3,532,819 | 10/1970 | Paine | 358/158 |
| 3,699,256 | 10/1972 | Roth | 358/153 |
| 3,949,199 | 4/1976 | Odom | |
| 4,064,541 | 12/1977 | Schneider et al. | 358/153 |
| 4,074,307 | 2/1978 | Dischert et al. | 358/19 |
| 4,219,890 | 8/1982 | Sugihara | |
| 4,227,251 | 10/1980 | Kazama et al. | 328/164 |
| 4,449,061 | 5/1984 | Yasuda et al. | 328/164 |
| 4,523,158 | 6/1985 | Megeid | 331/55 |

*Primary Examiner*—Jin F. Ng
*Attorney, Agent, or Firm*—Joseph S. Tripoli; Robert L. Troike; William H. Meise

[57] ABSTRACT

A bit-decision circuit or slicer for a digital communications receiver includes a first comparator which compares the received signal level with a reference slicing level. In order to have the lowest error rate, the reference slicing level must be controlled. Control is provided by periodic level indicating pulses in the transmitted signal. The level indicating pulses have predetermined nominal duration and controlled rise and fall times. A pulse width locked loop at the receiver responds to the level indicating pulse at the output of the comparator. The pulse width locked loop includes a start-stop oscillator which produces an odd or an even number of oscillations in response to each level-indicating pulse depending upon the ON time of the oscillator. A flip-flop coupled to the oscillator changes state during each oscillation, so that an even number of oscillations causes the flip-flop output to remain in the same state after the level indicating pulse as before, while an odd number of oscillations causes a change of state. The average D.C. level at the output of the flip-flop therefore changes significantly for a change of duration of the level indicating pulse corresponding to one clock oscillation cycle or a portion of a clock oscillator cycle. The flip-flop output level is filtered and applied as an input signal to a second comparator. The second comparator switches state in response to excursion of the filtered flip-flop signal above and below a reference level. The output of the second comparator is filtered to form the reference slicing level for the first comparator. This closes a pulse width locked loop which takes excursions between two extreme values of pulse width. The data pulses occurring in the interval between level indicating pulses are compared with the same reference level for low error rate.

20 Claims, 10 Drawing Figures

DIGITAL SLICER HAVING A PULSE-WIDTH LOCKED LOOP

This invention relates to a bit regenerator or slicer for a digital communications system. In order to reduce the burst error rate, the width of a pulse of predetermined known duration as received at a receiver is bit-decided or sliced under control of a pulse-width locked feedback loop for maintaining constant slicing level.

A fundamental goal in a receiver for a digital communications system is to minimize the amount of received power required in order to achieve a given bit error rate. For example, in optical fiber communication systems a photodetector at the receiver site or location detects the incident light signal and converts it into a small electrical current. A low-noise amplifier or preamplifier following the photodetector converts the current into a usable signal while introducing a minimal amount of additional noise. The signal at the output of the amplifier is applied to a digital regenerator or bit decision circuit in order to determine whether a logic zero (LOW) or a logic one (HIGH) was transmitted. The bit decision depends upon the slicing level or reference level chosen to represent the transition between a LOW and a HIGH. The choice of reference level is complicated by several factors, among which is the very small signal level, which for example in a typical optical fiber communications system may be less than 20 mV. Another complicating factor in high data rate systems is the direct coupling (DC coupling) between the photodetector and the comparator which is required in order to achieve bandwidth down to zero frequency and into the hundreds of MHz.

One prior technique for solving the bit decision problem is to select data codes at the transmitter which eliminate direct and low-frequency components of the signal. With the direct components eliminated, the signal at the receiver may be AC-coupled to the bit decision comparator, and the reference or slicing level can be established by using a low-pass filter to average the signal magnitude at the output of the comparator. A voltage divider is used to divide the average signal to produce the reference level for application to the comparator. When very high data rates are involved, the use of such specialized coding may not be cost-effective, because increased channel bandwidth is required. U.S. Pat. No. 4,219,890 issued Aug. 26, 1982, to Sugihara is an example of the complex circuit required to encode a signal at the transmitter with unequal amplitudes to compensate for DC voltage changes. In Sugihara, a plurality of delay circuits having durations equal to a multiple of one-half the bit clock duration is used for detecting the leading and trailing edges of the data. A bistable multivibrator is required which triggers reliably on an edge of the data. Commercial multivibrators are available which are specified for input pulse width. The Sugihara approach may be difficult to implement at data transmission rates of 216 Megabits/second (Mbit/sec), because the pulses applied to the bistable multivibrators are less than 2 nanoseconds (nsec) in duration, and the commercial multivibrators may not trigger reliably. A cost-effective digital regenerator or slicer which is adaptable for high data rates is desirable.

SUMMARY OF THE INVENTION

A slicer for a digital bit stream which includes a level indicating pulse having a predetermined nominal duration includes a controllable comparator having a first input terminal coupled for receiving the bit stream for comparing the instantaneous amplitude of the bit stream with a reference slicing signal applied to a second input terminal. The comparator generates bilevel signals representing bit decisions. The duration of the bilevel signals during the level indicating pulse interval is indicative of the instantaneous slicing level. A separator is coupled to the controllable comparator for separating the level indicating pulse from the data stream to produce a separated level indicating pulse. A start-stop oscillator is coupled to the separator and is responsive to the separated level indicating pulse for generating oscillations at a predetermined rate. The predetermined rate of oscillation is selected to produce a plurality of cycles of oscillation during an interval equal to the nominal duration of the level indicating pulse. A bistable circuit coupled to the controllable start-stop oscillator is responsive to each cycle of the oscillations for changing state to form an unfiltered or raw control signal. The raw control signal has a first state prior to receipt of each level indicating pulse, and has the same first state after the receipt of the level indicating pulse if the start-stop oscillator produces an even number of cycles of oscillation in response to the separated level indicating pulse. The raw control signal has a second state after receipt of the level indicating pulse if the start-stop oscillator produces an odd number of cycles. In this fashion, the average level of the raw control signal is made to vary in the interval between successive level indicating pulses, depending upon the slicing level upon which the comparator bases its bit decisions. A filter is coupled to the bistable circuit for receiving the raw control signal therefrom for filtering the raw control signal to produce a signal equivalent to the reference slicing signal. A feedback coupling arrangement is coupled to the filter and to the second input terminal of the comparator for controlling the slicing level in a feedback manner which maintains a substantially constant pulse width at the output of the coincidence circuit.

DESCRIPTION OF THE INVENTION

Figure 1:
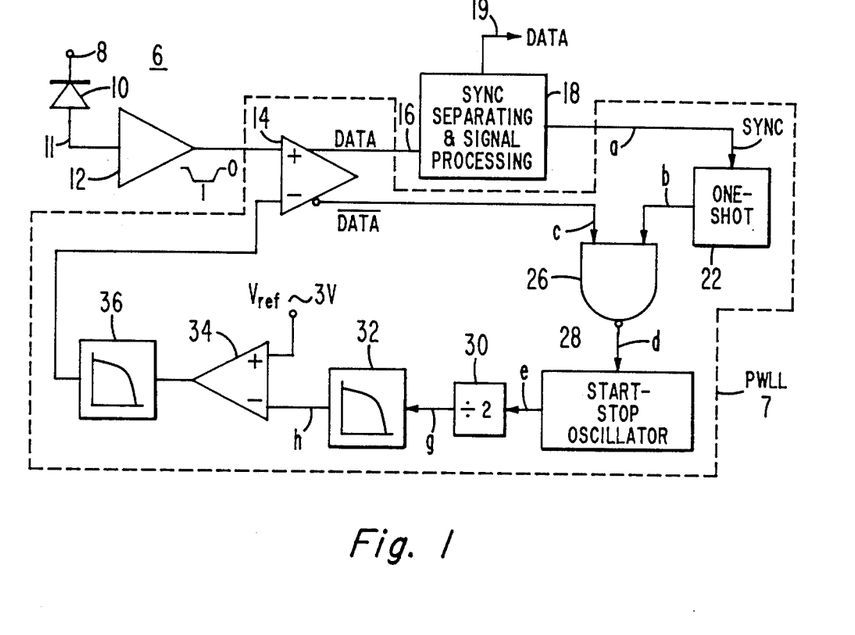
FIG. 1 is a simplified block diagram of a receiver for digitally modulated optical signals according to the invention.

In FIG. 1, a receiver 6 for digitally modulated light signals includes a terminal 8 adapted to be coupled to a fiber-optic bus for receiving the light signals therefrom, and a photodiode 10 coupled to terminal 8 for generating an electrical current on conductor 11 for application to a preamplifier or low-noise amplifier 12, which may be a transimpedance amplifier. The detected signal on conductor 11 includes data in the form of logic ONES and logic ZEROES interspersed periodically with synchronization words followed by level indicating pulses and their protection bits. The level indicating pulses are generated at a transmitter (discussed below in connection with FIG. 10) with at least constant duration and constant rise or fall times. If desired, the pulses may also have a predetermined nominal duration. These durations and rise and fall times provide information to receiver 6 allowing control of the slicing level. The synchronizing pulse is used as a timing reference to allow extraction of the level indicating pulse for processing for control of the slicing level.

The amplified data and level indicating pulses from preamplifier 12 are applied to a pulse width locked loop (PWLL) 7 which includes a comparator 14. The pulses are applied to a non-inverting (+) input of a comparator 14 for comparison with a slicing level coupled to the inverting (−) input of comparator 14. The inverted data stream (data) is coupled from comparator 14 by way of a conductor designated c to a first input terminal of a NAND gate 26. The inverted data stream includes inverted sync words, inverted level indicating pulses and inverted protection bits.

Figure 2:
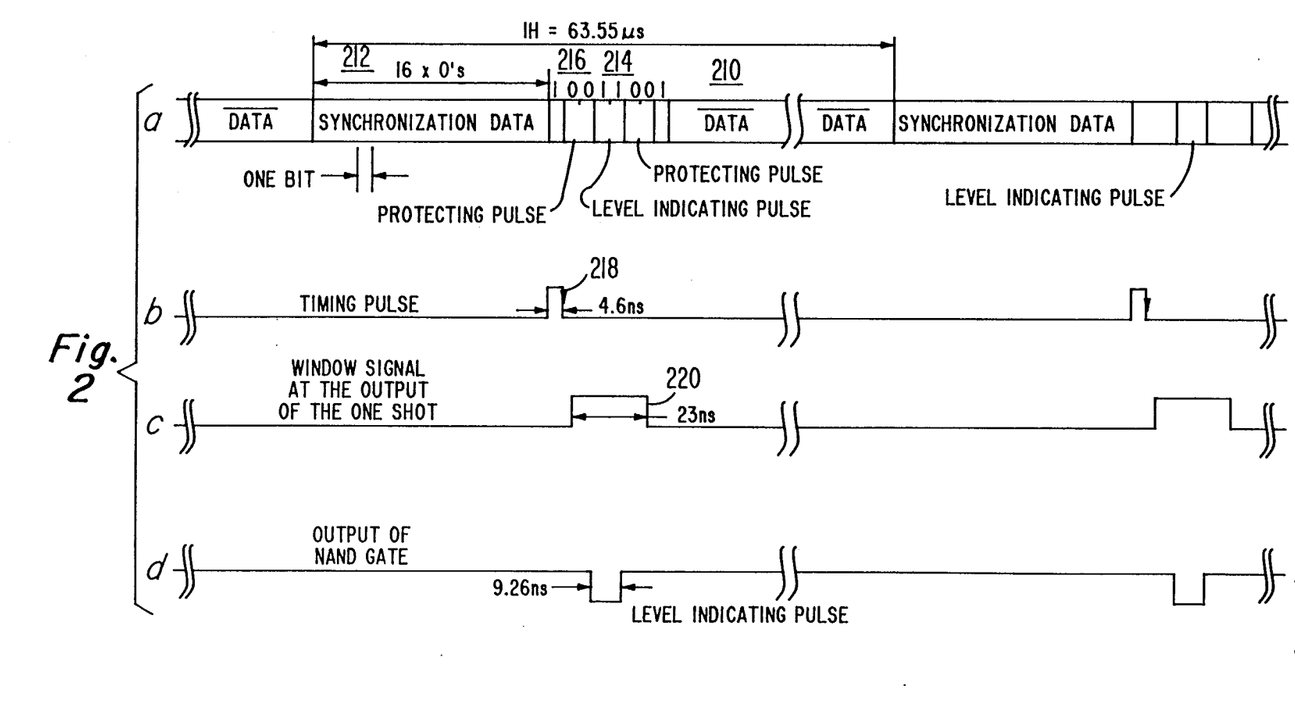
FIGS. 2 and 5 are amplitude-versus-time plots of signal voltages occcuring in the arrangements of FIG. 1, and FIGS. 3 and 4 are similar plots for times near the time of a level indicating pulse.

FIG. 2a illustrates as 210 the stream of inverted data, as 212 the inverted synchronization (sync) words or data, as 214 the inverted level indicating pulse and as 216 the inverted level indicating pulse protection pulses. The inverted sync word 212 consists of a stream of sixteen logic ZERO bits. The inverted level indicating pulse 214 consists of two successive logic ONE bits. In order to protect the integrity of the rise and fall times of the level indicating pulse, it is preceded and followed by a pair of protection pulses 216 each of which includes a pair of logic ZERO bits, which are in turn preceded and followed, respectively, by a logic ONE bit, all as illustrated in FIG. 2a. Thus, the inverted bit pattern of the level indicating pulse 214 and its protection pulses 216 is 10011001. The sync word recurrence rate as illustrated is 63.55 microseconds ($\mu$S), corresponding to the line recurrence rate of NTSC television. Thus, the data being transmitted may include television signals.

Referring once again to FIG. 1, the non-inverted data is coupled from comparator 14 to a sync separator and signal processing circuit illustrated as a block 18 which couples the data to an output conductor 19, and generates a timing or sync pulse illustrated as 218 in FIG. 2b having a duration of one bit interval during the bit interval following the receipt of the last bit of sychronizing data 212. Timing pulse 218 is coupled by way of a conductor designated a to a one-shot or astable multivibrator 22 which is part of PWLL 7. Multivibrator 22 is a one-shot which generates a window signal illustrated as 220 in FIG. 2c in response to the lagging edge of timing pulse 218. The window signal has a duration of five bit intervals encompassing the time during which the level indicating pulse (2 bits in duration) occurs. The window signal output of one-shot 22 is coupled over a conductor b to a second input of NAND gate 26. NAND 26 is enabled by the window signal and gates the inverted level indicating pulse (with a further inversion) over a conductor d to a control input terminal of a start-stop oscillator 28.

The output of start-stop oscillator 28 is applied over a conductor e to a divide-by-two frequency divider 30, and the divided frequency is applied to a low-pass filter 32 to form a filtered signal. The filtered signal is applied to a comparator amplifier 34 for comparison with a reference voltage $V_{ref}$, and the resulting bilevel signal is further filtered by a low-pass filter 36 before being applied to the inverting input terminal of comparator 14 as the reference slicing level.

Figure 3:
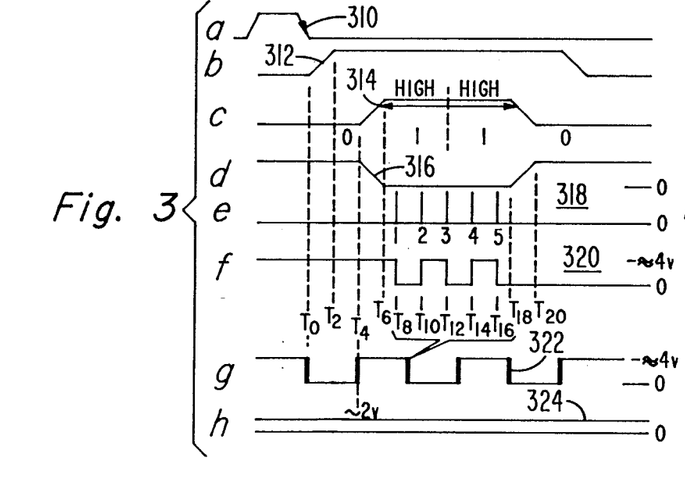
Figure 4:
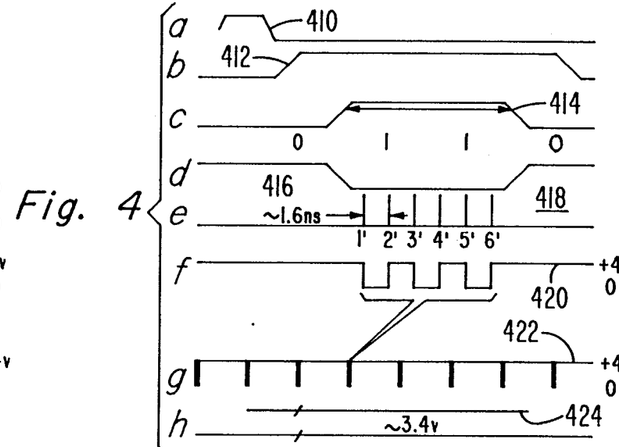

FIGS. 3 and 4 illustrate waveforms occurring in the arrangement of FIG. 1 for a system operating at 216 megabits/second (Mbit/sec), for which one clock (bit) cycle has a duration of 4.63 nsec. The noninverted level indicating pulse is a succession of two logic LOWS, and therefore has a nominal duration as transmitted of 9.26 nsec. The frequency of high-frequency oscillator 28 is about 640 MHz, which results in about 5 or 6 periods of oscillation during each level indicating pulse interval.

FIG. 3a illustrates as a waveform 310 the separated timing pulse applied to one-shot multivibrator 22. Waveform 312 of FIG. 3b illustrates the window signal output of multivibrator 22. It can be seen that NAND 26 is enabled by waveform 312 at least in the interval T2–T18. Since multivibrator 22 produces pulse 312 in response to the separated sync signal, the interval T2–T18 includes the level indicating pulse interval. The inverted level indicating pulse portion of the inverted data stream on conductor c is illustrated by waveform 314 of FIG. 3c. The inverted level indicating pulse in the interval T6–T16 as shown is somewhat shorter in duration than 9.26 nsec, resulting from a slicing level which is too low. The logic HIGH portion of waveform 314 occurs during a time when NAND 26 is otherwise enabled by pulse 312 on conductor b, and NAND 26 responds to produce a twice-inverted or noninverted level indicating pulse on conductor d which is illustrated as 316 of FIG. 3d. Pulse 316 enables start-stop oscillator 28, which oscillates to produces a succession of pulses illustrated in FIG. 3e and designated collectively as 318. As illustrated in FIG. 3e, for the particular illustrated duration of pulse 316, five clock pulses are generated by oscillator 28. The five clock pulses are designated 1–5, in order of their time of generation. Each of the pulses of set 318 applied to divider 30 causes a change in state of the divider, as illustrated by 320 in FIG. 3f. In can be seen that the output of divider 30 at times preceding time T8 is a HIGH, and each pulse of set 318 causes the state to change. Since pulse group 318 includes an odd number of pulses, the state of the output of divider 30 at the end of five-pulse group 318 is LOW.

Waveform 320 of FIG. 3f illustrates details of the transitions at the output of divider 30 at a time near the end of each sync pulse. It will be appreciated that at the recurrence rate of the sync pulses, the output signal from divider 30 will be a square wave, resulting from the alternation of level during each sync pulse. This is illustrated as waveform 322 of FIG. 3g, with that portion of waveform 322 illustrated in FIG. 3f indicated by a bracket. Since square wave 322 has a peak amplitude of approximately 4 volts, its average value is approximately 2 volts. Filter 32 averages the signal from frequency divider 30 and produces on conductor h a filtered first control signal illustrated as 324 of FIG. 3h, which has a magnitude of approximately 2 volts. Comparator 34 compares the reference three volt signal applied to its non-inverting input terminal with the signal 324 from the output of filter 32 to produce a bilevel signal. Comparator 34 is inverting, because when signal 324 is greater than +3 volts, the output voltage of the comparator is logic LOW, and when signal 324 is less then +3 volt, the output is logic HIGH. Comparator 34 closes the feedback loop in a degenerative manner, as will be explained below.

FIG. 4 illustrates waveforms which result when the duration of the sliced level indicating pulse from comparator 12 is greater than the desired 9.26 nsec; for the example given this is a duration somewhat greater than 9.3 nsec. Such a condition occurs when the slicing level is too high. Reference numbers for waveforms of FIG. 4 corresponding to waveforms of FIG. 3 are given the same reference number in the 400 series rather than in the 300 series. As can be seen, waveforms 410 and 412 correspond substantially with waveforms 310 and 312, respectively. Waveform 414, which is the inverted level indicating pulse, is somewhat wider or longer in duration than waveform 314 illustrated in FIG. 3. Waveform 416 has substantially the same duration as waveform 414. The greater duration of waveform 416 allows oscillator 28 to produce approximately six pulses rather than five as illustrated in FIG. 4e. As discussed below, operation at oscillator frequencies near the maximum toggle frequency of divider 30 may result in lack of response by divider 30 to a partial last clock pulse. As a result, divider 30 changes state an even number of times, and is left in the same state after the level indicating pulse is ended as it was in before the level indicating pulse. For the particular situation illustrated in FIG. 4f, waveform 420 has a logic HIGH level both before and after the level indicating pulse interval. As a result, the signal produced on conductor g and illustrated as 422 of FIG. 4g is at its logic HIGH level almost continuously. Since a logic HIGH corresponds to +4 volts, and there are only short intervals of logic ZERO, the average level of the signal on conductor g is approximately 3.4 volts. Signal 424 of FIG. 4h illustrates the filtered 3.4 volt level applied to the input of comparator 34 for comparison with the +3 volt reference level. It will be noted that as a result of the change in duration of the level indicating pulse corresponding to one 640 MHz oscillation cycle or less (as described below), the average voltage input to the inverting terminal of comparator 34 has gone from a voltage less than the reference level to a voltage greater than the reference level.

Figure 5:
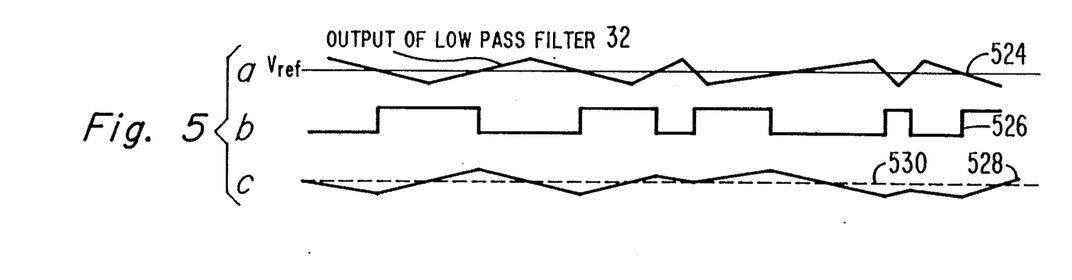

FIG. 5 illustrates the operation of the pulse-width stabilized loop or pulse-width locked loop (PWLL) 7 of receiver 6 over a relatively long period of time compared with FIGS. 3 and 4. Waveform 524 of FIG. 5a represents the voltage at the output of filter 32. It can be seen that the DC level makes excursions above and below the reference voltage $V_{ref}$. Waveform 526 of FIG. 5b represents the output of comparator 34 in response to the changes in voltage 524, and waveform 528 of FIG. 5c represents the output of filter 36 in response to comparator output signal 526. As can be seen from FIG. 5 and the above description, the loop switches between two states which drive the slicing level between positive and negative extremes of deviation from the desired level. The desired level is indicated by dashed line 530 of FIG. 5c.

It might appear that PWLL 7 as described cannot be made to be as accurate as a proportional feedback loop, because of the switching mode of operation. In actuality, a proportional feedback loop has a finite loop gain and can only urge the slicing level towards that level which provides the desired sliced pulse duration. As the slicing level approaches the desired level in a proportional-feedback system, the urging diminishes, so that the exact slicing level is never achieved. In the arrangement of the invention, however, the slicing level takes excursions above and below the exact slicing level, and dwells at and near the desired slicing level for substantial periods of time. Those bit decisions made during these dwell intervals are made at or near the exact slicing level and will tend to more error-free than bit decisions made with a proportionally-controlled slicing level. At times when the slicing level as controlled by the arrangement of the invention are near the maximum excursion from the desired level, the bit decisions are no more error-prone than for proportional control, so long as the oscillator's frequency gives sufficient fineness of control.

Figure 6:
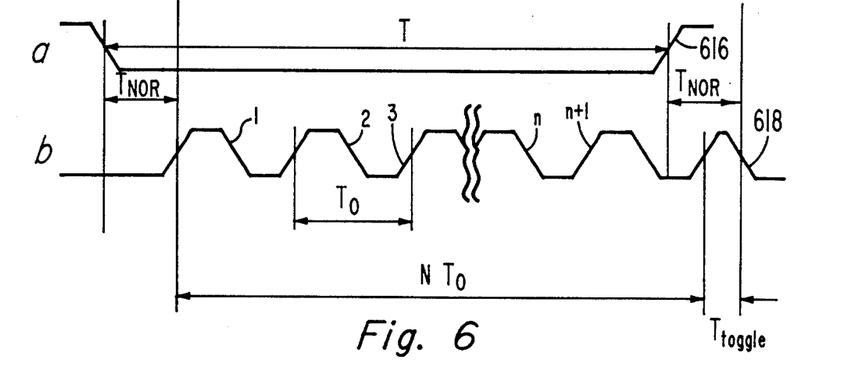
FIGS. 6 and 7 illustrate amplitude-versus-time plots of signal voltages occurring in the arrangement of FIG. 1 during operation.

The PWLL is very sensitive to changes in the width of the level indicating pulse and hence to any deviation of the slicing level from the correct value. The reason is that in practice the D-type latch used to implement divide-by-two circuit 30 can only detect clock pulses having frequency lower than its maximum toggle frequency ($f_{toggle}$ max). Thus, circuit 30 responds reliably to a complete pulse from oscillator 28, but may not change state in response to a partial pulse. FIG. 6a illustrates as 616 the level indicating pulse at conductor c at the input of NAND 26, and FIG. 6b illustrates complete oscillator 28 output pulses 1, 2, 3 ... n, n+1 and an incomplete pulse 618 produced by oscillator 28 in response to the separated level indicating pulse coupled from NAND 26 to conductor d. As can be seen, pulse 618 is narrower in width or has a lesser duration than do pulses 1 through (n+1), because the duration of the level indicating pulse 616 is less than an integer number of oscillator pulses long. Because of this reduction in duration of pulse 618, the frequency corresponding to pulse 618 is greater than the frequencies represented by pulses 1 through (n+1). As the duration of last pulse 618 is reduced due to reduction in the duration of pulse 616, at some point divider 30 will cease to respond to the partial pulse. In other words, the latch misses the last clock pulse long before it actually disappears, which surprisingly results in reduced loop error. The PWLL is automatically locked to the state where the last pulse of the start-stop oscillator is nearly equal to $T_{toggle}$ (min), $$T_{toggle}(min) = \frac{1}{2 f_{toggle}(max)}$$

as will be shown.

The following example shows how to use this criterion in selecting parameters in the design of a PWLL:

Design example (1):

Assuming that,
T = width of the level indicating pulse, and
$f_{toggle}$ (max) = the max toggle frequency of the D-type latch.

$T_{toggle}(min) = \frac{1}{2 f_{toggle}(max)}$ = the minimum pulse width which can be detected by the D-type latch.

$T_o = \frac{1}{f_o}$ = Period of one clock cycle of start-stop oscillator 28

$T_{NOR}$ = propagation delay of the NOR-gate used as a start-stop oscillator, which determines the time elapsed before the oscillator starts (or stop) oscillation after being enable (disabled).

N = number of complete clock cycles.
It follows from FIG. 6 that $$T + T_{NOR} = T_{NOR} + NT_o + T_{toggle} \text{ (min)}$$

$$T = NT_o + T_{toggle} \text{ (min)}$$

$$T_o = \frac{T - T_{toggle} \text{ (min)}}{N}$$

$$f_o = \frac{N}{T - T_{toggle} \text{ (min)}}$$

This is the general equation required to calculate the oscillator frequency for a given application. For instance, for the 216 Mb/s system the oscillator frequency is calculated as follows:

| | |
|---|---|
| $T = 9.26$ nanoseconds (ns) | (this corresponds to the duration of two bit clock intervals) |
| $f_{toggle}$ (max) = 750 MHz | (for Latch 11C06 manufactured by Fairchild) |

$$T_{toggle} \text{ (min)} = \frac{10^{-6}}{750} = 0.67 \text{ ns}$$

$N = 1$, for stable oscillator frequency.

$$f_0 = \frac{N}{T - T_{toggle} \text{ (min)}} = 116.414 \text{ MHz}$$

Figure 7:
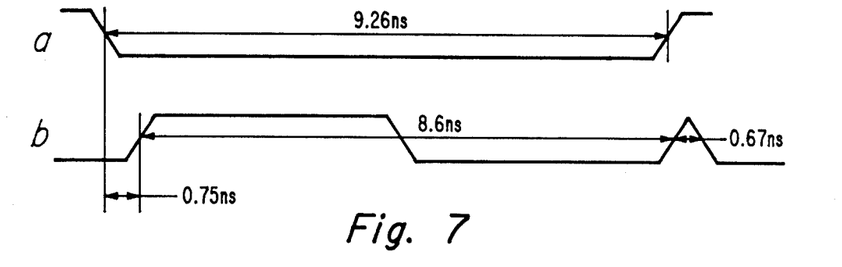

It should be noted that the oscillator frequency is lower than the system clock frequency, see FIG. 7.

If the level indicating pulse were to be chosen to be in the range of some 100 ns, as in the following design example, it would be necessary to take higher value for N than 1.

Design example (2)

Assuming a 100 Mb/s transmission link.

| | |
|---|---|
| $T = 100$ ns | (for Latch F10131 Fairchild) |
| system clock = 100 MHz | |
| $f_{toggle} = 160$ MHZ | |
| $T_{toggle}$ (min) = 3.215 ns | |
| $N = 5$ | |

$$f_o = \frac{N}{T - T_{toggle} \text{ (min)}} = 51.6 \text{ MHz}$$

Figure 8:
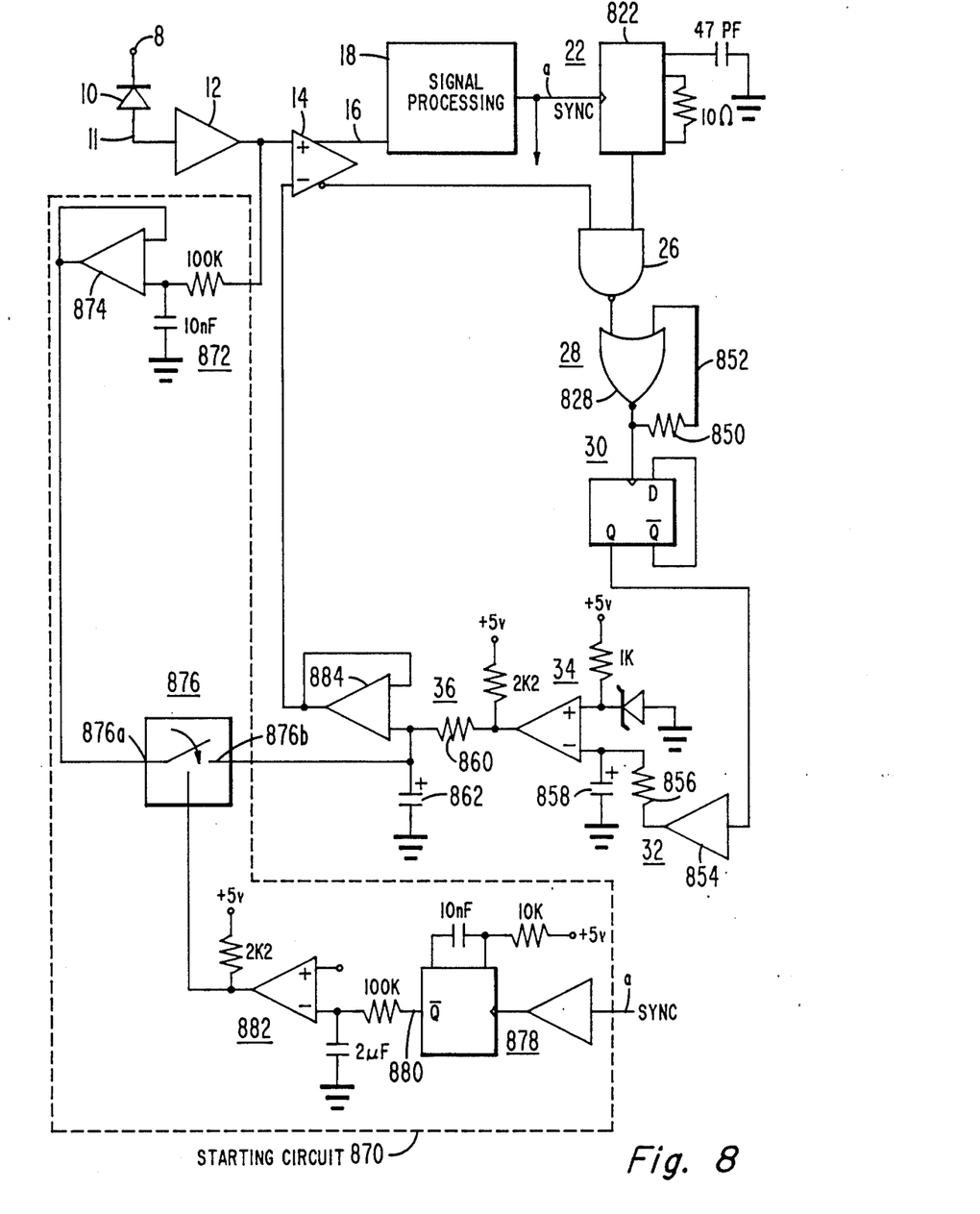
FIG. 8 is a more detailed block diagram of the arrangement of FIG. 1.

FIG. 8 is a more detailed block diagram of the arrangement of FIG. 1 and includes a starting circuit. In FIG. 8, elements corresponding to those of FIG. 1 are designated by the same reference numbers. Multivibrator 22 includes an integrated-circuit monostable 822 which is a type MC10198 manufactured by Motorola, and requires a 47 pF capacitor and 10 ohm resistor in order to produce a pulse duration of approximately 23 ns. Gate 26 is a type MC10104 NAND. Start-stop oscillator 28 is of a known type which includes a NOR-gate 828 which is an integrated-circuit type F100102 manufactured by Fairchild, together with a transmission line illustrated as 852 coupling its output to an input terminal. Line 852 has a delay calculated to give the desired frequency of operation and includes a series resistor 850 matching the characteristic impedance of the transmission line. Frequency divider 30 is implemented as a D-type flip flop 11C06 manufactured by Fairchild. Filter 32 includes an ECL-to-TTL translator 854, a series 100K resistor 856 and a shunt 2 μF (microfarad) capacitor 858. Comparator 34 is a type LM339, and filter 36 includes a series 100k resistor 860 and a 47 μF capacitor 862.

Upon initial turn-on there may be no sync signal available since the synchronizing signal is only available at the output of sync separator and signal processor 18 if the slicing level is approximately correct. Consequently, the starting circuit illustrated within dashed block 870 is useful in order to aid in starting operation. The starting circuit within dashed block 870 includes a low-pass filter designated generally 872 coupled to the output of preamplifier 12 for averaging the received signal to produce an approximation of the slicing level, and a buffer amplifier 874 for coupling the average signal to a terminal 876a of a switch 876. At initial turn-on, or if separated sync pulses are absent, the output signal on conductor 880 from monostable multivibrator 878 is logic HIGH, and switch drive circuit 882 responds thereto to close switch 876 to couple contact 876a to contact 876b. This applies the approximately-correct average signal level from buffer 874 across capacitor 862 of filter 36. This approximately-correct signal is applied by buffer 884 to the inverting input of comparator 14 in order to allow bit-decision operation to begin. Once sync words are detected by separator 18, they trigger monostable 878 to produce on conductor 880 a logic LOW level. The time constant of multivibrator 878 is selected so that loss of a few sync pulses returns the signal on conductor 880 to a logic HIGH level to initiate the start mode.

Figure 9:
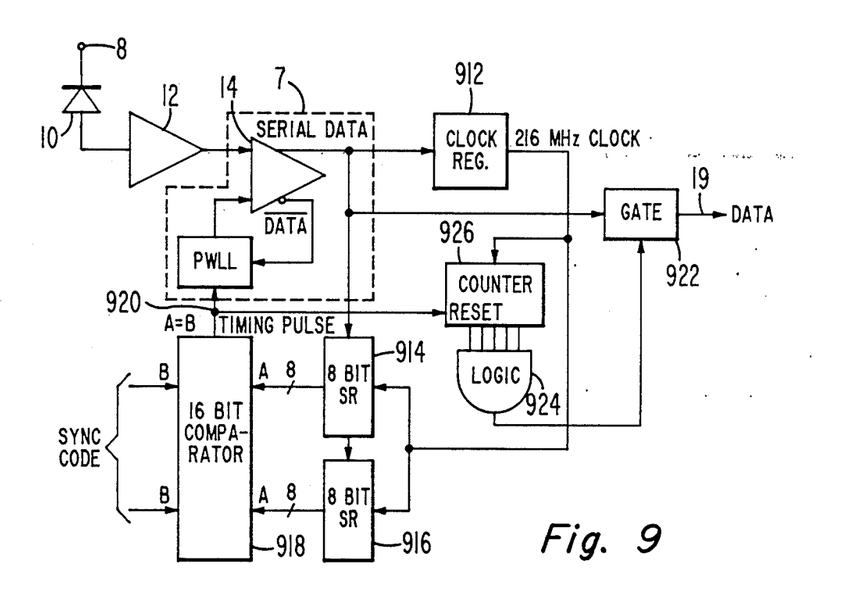
FIG. 9 is a block diagram of a level indicating pulse separating circuit suitable for use in the arrangements of FIGS. 1 and 8.

FIG. 9 illustrates details of sync separator or identifier 18, together with certain portions of receiver 6. In FIG. 9, elements corresponding to the elements of FIG. 1 have corresponding reference numerals. Sync separator 18 is basically a correlator which compares the incoming bit pattern with a stored sync pattern. Sync separator 18 includes a bit clock regenerator 912 for generating clock pulses, which are applied to clock a pair of cascaded 8-bit shift registers 914 and 916. Shift-registers 914 and 916 are coupled to receive the noninverted data stream from comparator 14, and sequentially clock the data through the total of 16 bits. Thus, shift registers 914 and 916 together contain or store the last 16 bits of the data stream. Noting that the synchronizing word pattern is 16 successive logic ONE bits, it will be clear that at the instant at which the arriving synchronizing word ends, the outputs of the shift registers will be all-logic ONE. The 16 shift register outputs are coupled to a 16-bit comparator 918 for comparison with a stored sync word pattern. When comparator 918 finds a match, it produces on conductor 920 the sync or timing pulse illustrated as 218 in FIG. 2, for application to PWLL 7. The data portion of serial data at the output of comparator 14 is gated to output conductor 19 by a gate 922 controlled by a logic circuit 924 responsive to those counts of a clock pulse counter 926 corresponding to data times. Counter 926 is reset by each timing pulse on conductor 920.

Figure 10:
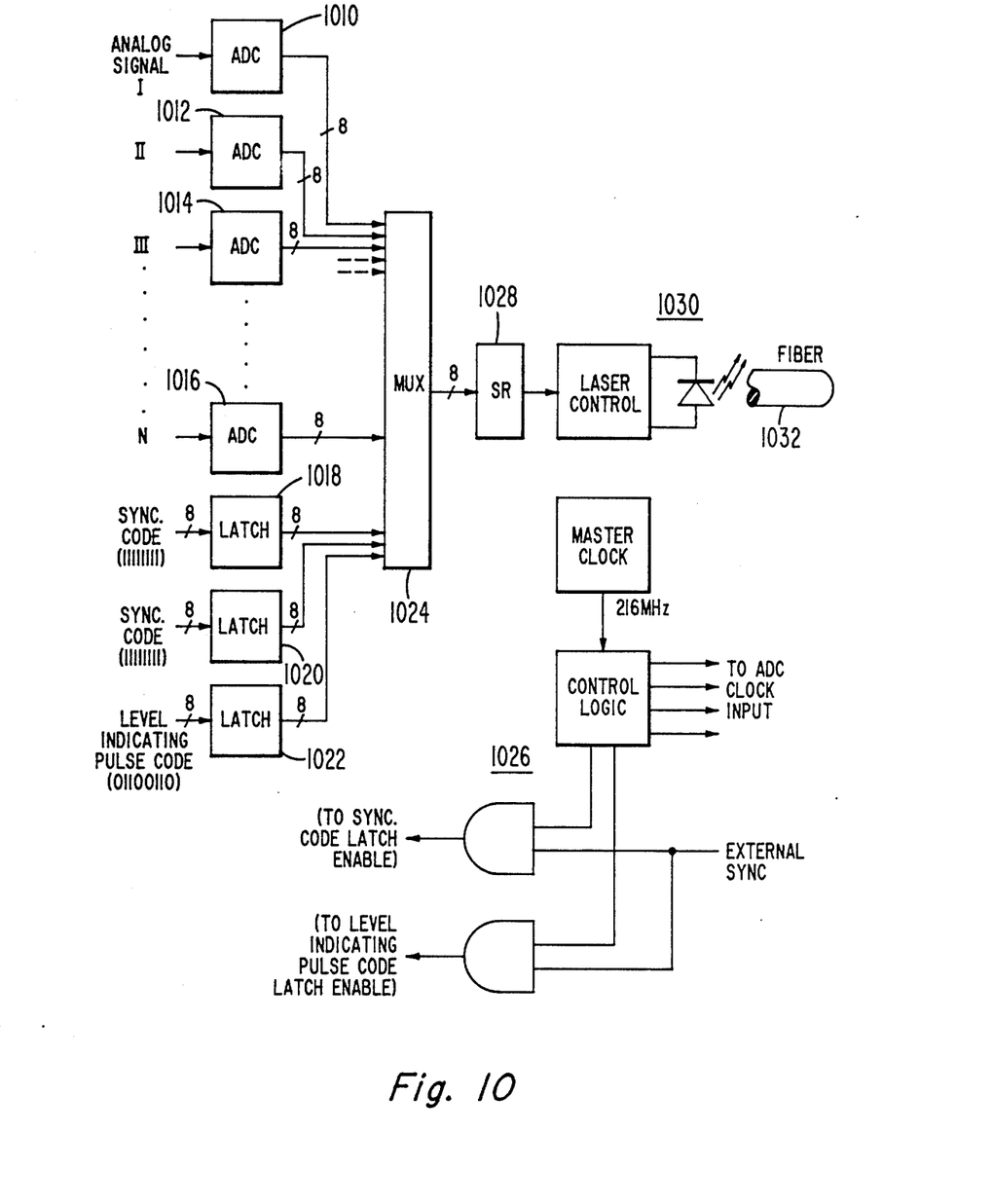
FIG. 10 is a block diagram of a transmitter suitable for use with the receiver of FIGS. 1 and 5.

FIG. 10 is a simplified block diagram of a digital transmitter for receiving digital data and for producing a stream of digital data interspersed with periodic level indicating pulses having rise and fall times and controlled duration.

In FIG. 10, a plurality of analog signal sources designated by Roman numerals I, II, III . . . N are coupled to analog-to-digital converters (ADC) 1010, 1012, 1014, . . . 1016, respectively, for producing multichannel parallel digital data. Two 8-bit latches 1018, 1020 hold their respective portions of the 16-bit sync word, and a third latch 1022 holds the 8-bit code of protection bits and level indicating pulse bits. A multiplexer 1024 multiplexes together the parallel data signals from the various sources and latches under control of clocked control logic illustrated generally as 1026. The multiplexed parallel data is converted to serial form in the format illustrated in FIG. 2a by a shift register 1028. The serial data is converted to an optical signal by a controlled laser designated generally as 1030 which transmits the light over fiber 1032 to terminal 8 of FIG. 1. The duration of the level indicating pulse is established by the transmitter clock, and the rise and fall times of the level indicating pulse are established by the characteristics of the various gates in the transmitter, and those characteristics do not normally change during operation.

Other embodiments of the invention will be obvious to those skilled in the art. In particular, the start-stop oscillator clock rate may be selected to provide any number of oscillator cycles during the level indicating pulse. The level indicating pulse may be used both for level indicating and for synchronization, if desired. The digital communication system may use other methods for transmitting pulses, rather than the optical-fiber system as described. Other such types of communication may be microwave radiation, infrared or sonic transmissions.

What is claimed is:

1. An adaptive slicer for a bit stream, which bit stream includes level indicating pulses having a predetermined nominal duration and finite rise and fall times, the slicer comprising:

controllable comparator means including a first input terminal and a second input terminal, said first input terminal being coupled for receiving said bit stream and for comparing the instantaneous amplitude of said bit stream with a reference slicing level signal applied to said second input terminal for generating bilevel signals representing bit decisions, the duration of said bilevel signals during said level indicating pulse being indicative of the instantaneous slicing level;

pulse separating means coupled to said controllable comparator means for separating said level indicative pulse portion of said bilevel signals from the remainder of said bit stream to produce a separated level indicating pulse;

controllable start-stop oscillator means coupled to said pulse separating means and responsive to said separated level indicating pulse for generating oscillations at a rate such that a plurality of cycles of said oscillations occur during an interval equal to said nominal duration;

bistable means coupled to said controllable start-stop oscillator means and responsive to each cycle of said oscillations for changing state to form an umprocessed raw control signal, said unprocessed control signal having a first state prior to receipt of each level indicating pulse, and having said first state after receipt of said level indicating pulse if said controllable start-stop oscillator means produces an even number of said cycles of said oscillations in response to said separated level indicating pulse, and having a second state after receipt of said level indicating pulse if said controllable start-stop oscillator means produces an odd number of said cycles of said oscillations in response to said separated level indicating pulse, whereby the average level of said unprocessed control signal varies in the interval between said level indicating pulses depending upon the slicing level;

first filter means coupled to said bistable means for receiving said unprocessed control signal therefrom for filtering said unprocessed control signal to produce a first control signal;

second comparator means coupled to said first filter means for comparing said first control signal with a predetermined reference level to generate a bilevel compared output signal which changes state when said first control signal passes through a value corresponding to said predetermined reference level;

second filter means coupled to said second comparator means and to said second input terminal of said controllable comparator means for filtering said bilevel compared output signal to form said reference slicing level, and for applying said reference slicing level to said second input terminal of said controllable comparator means to form a pulse width locked control loop for maintaining said slicing level near a predetermined value.

2. An adaptive slicer according to claim 1 wherein said controllable start-stop oscillator means comprises:

a NOR gate including first and second input terminals and also including an output terminal;

transmission-line means coupled between said first input terminal and said output terminal, said transmission-line means having a predetermined delay; and coupling means coupled to said pulse separating means and to said second input terminal of said NOR gate for coupling said separated level indicating pulse to said second input terminal of said NOR gate whereby a logic HIGH level of said separated level indicating pulse causes said oscillations at a rate controlled by said delay.

3. A slicer according to claim 1 wherein said bistable means comprises a D-type flip-flop.

4. A slicer according to claim 1 wherein each of said first and second filter means comprises series-coupled resistance means and shunt-coupled capacitance means.

5. An adaptive slicer for a bit stream, which bit stream includes recurrent sync information and level indicating pulses having a predetermined nominal duration and finite rise and fall times, the slicer comprising:

controllable comparator means including a first input terminal and a second input terminal, said first input terminal being coupled for receiving said bit stream and for comparing the instantaneous amplitude of said bit stream with a reference slicing level signal applied to said second input terminal for generating inverted and noninverted bilevel signals representing bit decisions, the duration of at least one of said inverted and noninverted bilevel signals during said level indicating pulse being indicative of the instantaneous slicing level;

sync separating means coupled to said controllable comparator means for separating said sync information from one of said inverted and noninverted bilevel signals from the remainder of said bit stream to produce a generated sync pulse;

pulse generating means coupled to said sync separating means for generating a window pulse having a predetermined duration in response to an edge of said generated pulse;

coincidence means including a first input terminal coupled to said pulse generating means for receiving said window pulse and also including a second input terminal coupled to said controllable comparator means for receiving one of said inverted and noninverted bilevel signals for generating a bilevel coincidence signal in response to said level indicating pulses;

controllable start-stop oscillator means coupled to said coincidence means and responsive to one level of said bilevel coincidence signal for generating oscillations at a rate such that a plurality of cycles of said oscillations occur during an interval equal to said nominal duration;

bistable means coupled to said controllable start-stop oscillator means and responsive to each cycle of said oscillations for changing state to form a raw control signal, said raw control signal having a first state prior to receipt of each level indicating pulse, and having said first state after receipt of said level indicating pulse if said controllable start-stop oscillator means produces an even number of said cycles of said oscillations in response to said separated level indicating pulse, and having a second state after receipt of said level indicating pulse if said controllable start-stop oscillator means produces an odd number of said cycles of said oscillations in response to said separated level indicating pulse, whereby the average level of said raw control signal varies in the interval between said level indicating pulses depending upon the slicing level;

first filter means coupled to said bistable means for receiving said raw control signal therefrom for filtering said raw control signal to produce a first control signal;

second comparator means coupled to said first filter means for comparing said first control signal with a predetermined reference level to generate a bilevel compared output signal which changes state when said first control signal passes through a value corresponding to said predetermined reference level;

second filter means coupled to said second comparator means and to said second input terminal of said controllable comparator means for filtering said bilevel compared output signal to form said reference slicing level, and for applying said reference slicing level to said second input terminal of said controllable comparator means to form a pulse width locked control loop for maintaining said slicing level near a predetermined value.

6. An adaptive slicer according to claim 5 wherein said controllable start-stop oscillator means comprises:
a NOR gate including first and second input terminals and also including an output terminal;
transmission-line means coupled between said first input terminal and said output terminal, said transmission-line means having a predetermined delay; and
coupling means coupled to said pulse separating means and to said second input terminal of said NOR gate for coupling said separated level indicating pulse to said second input terminal of said NOR gate whereby a logic HIGH level of said separated level indicating pulse causes said oscillations at a rate controlled by said delay.

7. A slicer according to claim 5 wherein said bistable means comprises a D-type flip-flop.

8. A slicer according to claim 5 wherein each of said first and second filter means comprises series-coupled resistance means and shunt-coupled capacitance means.

9. A slicer according to claim 5 wherein said sync separating means comprises a correlator responsive to a predetermined bit pattern of said sync information.

10. A slicer according to claim 9 wherein said correlator comprises:
bit clock regeneration means coupled to said controllable comparator means for regenerating bit carrier from said bilevel signals;
shift register means coupled to said controllable comparator means and to said bit clock regenerating means for storing and shifting said bilevel signals for a predetermined number of clock cycles, and for making at least some of the resulting stored and shifted bilevel signals available at parallel output terminals;
a source of said predetermined bit pattern; and
comparison means coupled to said parallel output terminals of said shift register means and to said source of said predetermined bit pattern for comparing said stored and shifted bilevel signals with said predetermined bit pattern and for generating said generated sync pulse.

11. A binary communications arrangement, comprising:
a source of binary information;
a source of level indicating pulses having rise and fall times which remain constant;
multiplexing and transmitting means coupled to said source of binary information and to said source of level indicating pulse for multiplexing said binary information together with said level indicating pulses to form a transmitted signal;
first comparator means coupled to said multiplexing and transmitting means for comparing said transmitted signal with a controllable reference voltage for generating compared pulses including compared level indicating pulses;
gated oscillator means coupled to said first comparator means for generating bursts of oscillations in response to said compared level indicating pulses;
bistable means coupled to said gated oscillator means for changing state in response to each of said oscillations in said bursts of oscillations, said bistable means producing an output signal having a first state before receipt by said gated oscillator means of said compared level indicating pulses and having a second state after receipt by said gated comparator means of said compared level indicating pulse if the duration of said compared level indicating pulse substantially corresponds to the duration of an odd number of said oscillations, and having said first state after receipt by said gated comparator means of said compared level indicating pulse if the duration of said compared level indicating pulse substantially corresponds to the duration of an even number of said oscillations;
first filter means coupled to said bistable means for filtering said output signal of said bistable means for producing a first averaged signal;
second comparator means coupled to said first filter means for comparing said first averaged signal with a reference voltage having a value intermediate the voltages represented by said first and second states of said output signal of said bistable means for generating an unfiltered control signal; and
second filter means coupled to said first comparator means and to said second comparator means for filtering said unfiltered control signal to generate said controllable reference voltage, whereby the duration of said compared pulses is held substantially constant.

12. An arrangement according to claim 11 wherein said multiplexing and transmitting means comprises an optical transmitter, an optical transmission path and an optical receiver, said optical receiver being coupled to the input of said first comparator means.

13. An arrangement according to claim 11 wherein said bistable means comprises a D-type flip-flop having its data input terminal coupled to its Q output terminal, its clock input terminal coupled to said gated oscillator for receiving said bursts of oscillations therefrom for producing said output signal at its Q output terminal.

14. An arrangement according to claim 11 wherein said gated oscillator means comprises:
bit clock regeneration means coupled to said first comparator means for regenerating bit carrier from said transmitted signal;
shift register means coupled to said first comparator means and to said bit clock regenerating means for storing and shifting said compared pulses and for making at least some of the resulting stored and shifted compared pulses available at parallel output terminals;
a source of predetermined bit pattern;
gating pulse generating means coupled to said source of predetermined bit pattern and to said shift register means for generating a level indicating pulse gating signal in response to a predetermined pattern of said stored and shifted compared pulses;
gating means coupled to said first comparator means and to said gating pulse generating means for gating compared pulses representative of said level indicating pulses; and
start-stop oscillator means coupled to said gating means for generating said bursts of oscillations in response to said compared pulses representative of said level indicating pulses.

15. A digital slicer for a bit stream, said bit stream including level indicating pulses, said slicer comprising:
comparator means including first and second input terminals, said first input terminal being coupled for receiving said bit stream and said second input terminal being coupled for receiving a reference slicing signal, for comparing said bit stream with said reference slicing signal for generating compared pulses including compared level indicating pulses;
gated oscillator means coupled to said comparator means for generating bursts of oscillations in response to said compared level indicating pulses;
bistable means coupled to said gated oscillator means for changing state in response to each of said oscillations in said bursts of oscillations, said bistable means producing an output signal having a first state before receipt of each of said bursts of oscillators and having a second state after receipt of one of said bursts of oscillations containing an odd number of oscillations and having said first state after receipt of one of said bursts of oscillations containing an even number of oscillations;
averaging and control signal processing means coupled to said bistable means for averaging said first and second states of said output signal of said bistable means and for processing the signal so averaged to generate said reference slicing level; and
coupling means coupled to said averaging and control signal processing means and to said comparator means for coupling said reference slicing level to said comparator means with a polarity selected to maintain constant duration of said compared level indicating pulses.

16. A slicer according to claim 15 wherein said averaging and control signal processing means comprises:
first filter means coupled to said bistable means for averaging said output signal of said bistable means to produce a filtered control signal;
second comparator means coupled to said first filter means for comparing said filtered control signal with a reference signal for generating a second bilevel signal; and
second filter means coupled to said second comparator means for averaging said second bilevel signal to produce said reference slicing level.

17. A slicer according to claim 15 wherein said gated oscillator means comprises:
correlator means coupled to said comparator means for generating timing pulses having a particular timing relation with said level indicating pulses;
gating window pulse generating means coupled to said correlator means for generating a gating window pulse in response to each said timing pulse;
gating means coupled to said comparator and to said gating window pulse generating means for gating each said level indicating pulse to an output terminal; and
start-stop oscillator means coupled to said gating means for generating said bursts of oscillations in response to each said level indicating pulse.

18. A slicer according to claim 15, said slicer further including a starting circuit, comprising:
start signal generating means coupled to said first input terminal of said comparator means for averaging said bit stream to produce a start signal approximating said slicing level;
level indicating pulse separation indicating means coupled to said gated oscillator means for generating a start enable signal indicating lack of said compared level indicating pulses; and
start signal gating means coupled to said start signal generating means and to said level indicating pulse separation indicating means for gating said start signal to said coupling means for application of said start signal to said comparator means to aid in starting.

19. A slicer according to claim 15 wherein said bit stream represent a television signal which includes a television synchronizing signal having a unique bit pattern.

20. A slicer according to claim 19 further comprising:
synchronizing signal identifying means including a memory for storing a bit pattern corresponding to said unique bit pattern, a clocked store coupled to said comparator for storing successive bits, and correlator means coupled to said clocked store and to said memory for comparing bits of said clocked store with bits of said memory for generating a signal representing arrival of said synchronizing signal.

* * * * *